US00RE38379E

(19) United States
(12) Reissued Patent
Hara et al.

(10) Patent Number: US RE38,379 E
(45) Date of Reissued Patent: Jan. 6, 2004

(54) SEMICONDUCTOR MEMORY WITH ALTERNATELY MULTIPLEXED ROW AND COLUMN ADDRESSING

(75) Inventors: Kouji Hara, Hadano (JP); Ryoichi Kurihara, Hadano (JP)

(73) Assignee: Hitachi, Ltd., Tokyo (JP)

(21) Appl. No.: 08/184,070

(22) Filed: Jan. 21, 1994

Related U.S. Patent Documents

Reissue of:
(64) Patent No.: 5,083,296
Issued: Jan. 21, 1992
Appl. No.: 07/568,166
Filed: Aug. 16, 1990

(30) Foreign Application Priority Data

Aug. 28, 1989 (JP) ..... 1-221068

(51) Int. Cl.[7] ..... G11C 8/04
(52) U.S. Cl. ..... 365/230.02; 365/230.08; 365/233
(58) Field of Search ..... 365/238.5, 233, 365/233.5, 230.08, 230.02, 190

(56) References Cited

U.S. PATENT DOCUMENTS 4,422,160 A * 12/1983 Watanabe ..... 365/238.5
4,669,064 A * 5/1987 Ishimoto ..... 365/238.5
4,750,839 A * 6/1988 Wang et al. ..... 365/238.5
4,831,597 A * 5/1989 Fuse ..... 365/233
4,845,677 A * 7/1989 Chappell et al. ..... 365/189.02
4,873,663 A * 10/1989 Baranyai ..... 365/233
4,912,679 A * 3/1990 Shinoda ..... 365/233
4,916,670 A * 4/1990 Suzuki ..... 365/233
4,970,687 A * 11/1990 Usami et al. ..... 365/233
4,985,868 A * 1/1991 Nakano ..... 365/230.08
4,989,182 A 1/1991 Mochizuki et al.
5,014,245 A * 5/1991 Muroka et al. ..... 365/233
5,031,150 A * 7/1991 Ohsawa ..... 365/233
5,043,947 A * 8/1991 Oshima et al. ..... 365/233
5,155,705 A * 10/1992 Goto et al. ..... 365/238.5

FOREIGN PATENT DOCUMENTS

JP 62-223891 10/1987
JP 64-14790 1/1989
JP 1-94592 4/1989

* cited by examiner

*Primary Examiner*—A. Zarabian
(74) *Attorney, Agent, or Firm*—Mattingly, Stanger & Malur, P.C.

(57) ABSTRACT

The semiconductor memory receives an external clock signal and has the memory cell array access operation controlled based on the clock signal. In the application of this semiconductor memory to a dynamic RAM, for example, a row address and column address are introduced in synchronism with the clock signal. The read, write and refresh operations are controlled based on the clock signal.

33 Claims, 6 Drawing Sheets

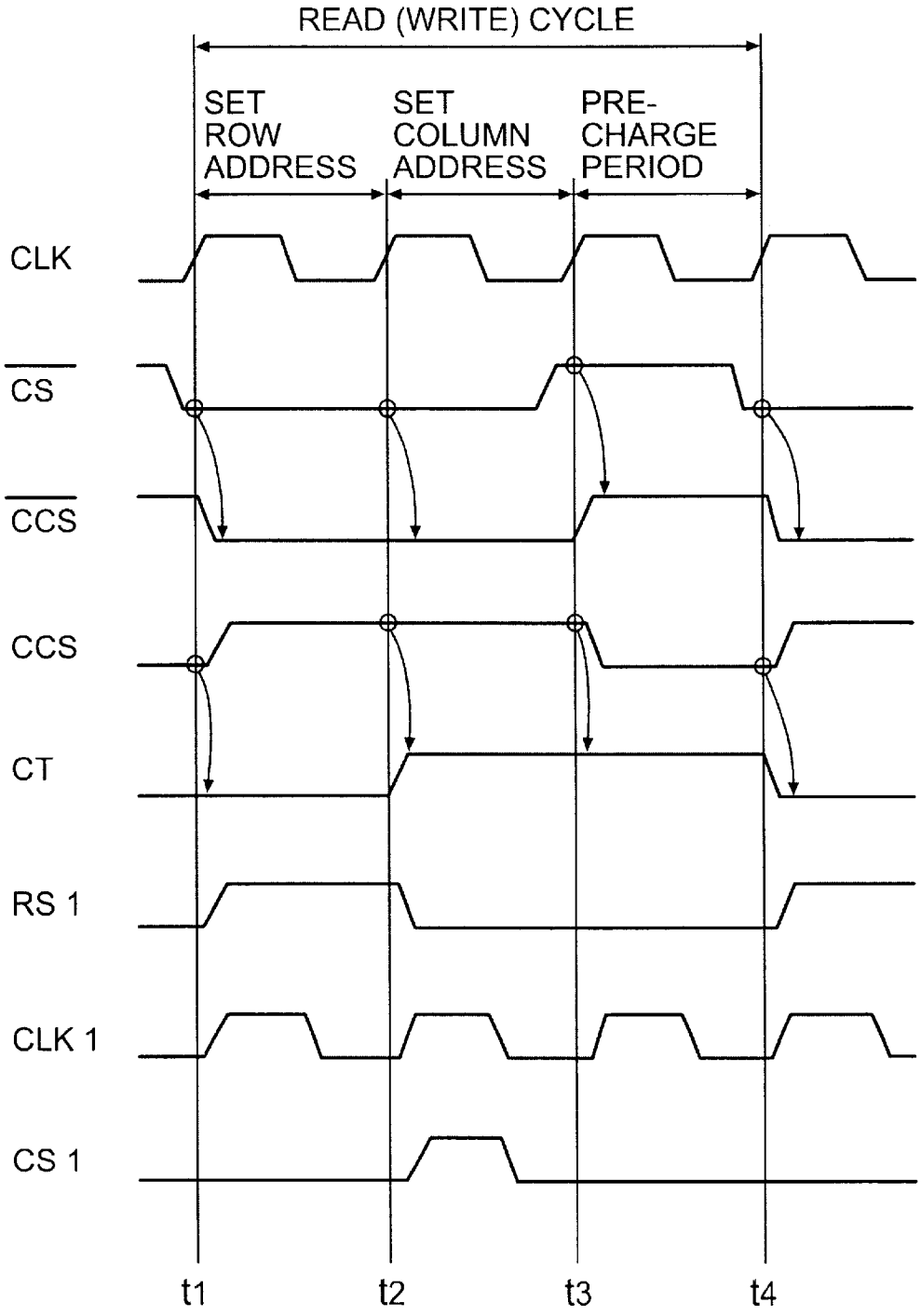
AMENDED
FIG. 4

SEMICONDUCTOR MEMORY WITH ALTERNATELY MULTIPLEXED ROW AND COLUMN ADDRESSING

Matter enclosed in heavy brackets [ ] appears in the original patent but forms no part of this reissue specification; matter printed in italics indicates the additions made by reissue.

BACKGROUND OF THE INVENTION

This invention relates to a semiconductor memory, such as a dynamic RAM, for example.

Conventional semiconductor memories, such as dynamic RAMs, are based on the input multiplexing of the row address and column address, and they necessitate a row address strobe, column address strobe and several other timing signals including write control signals, as is well known in the art.

A computer system generally operates in synchronism with a constant system clock, and data to be read out or written into a storage unit is transferred also in synchronism with the system clock. Accordingly, for a storage unit based on the dynamic RAM, in which several timing signals are produced from the system clock, these timing signals need to be set to meet the prescribed timings even in the worst condition in consideration of the variability in the signal delay time, crosstalk noise, and the like. On this account, conventional semiconductor memories cannot fully exert their inherent performances.

SUMMARY OF THE INVENTION

An object of this invention is to provide a semiconductor memory, e.g., a dynamic RAM, which operates with its full performance.

The inventive address-multiplexed semiconductor memory is designed to receive a clock signal and a chip select signal from the outside and have its memory cell array access controlled based on the clock signal. Consequently, by supplying an external clock signal which meets the performance of the semiconductor memory, it can operate with its full performance.

BRIEF DESCRIPTION OF THE DRAWINGS

FIGS. 4, 5 and 6 are timing charts used to explain the operation of the arrangement shown in FIG. 3.

DESCRIPTION OF THE PREFERRED EMBODIMENT

A specific embodiment of this invention will be described with reference to the drawings.

Figure 1:
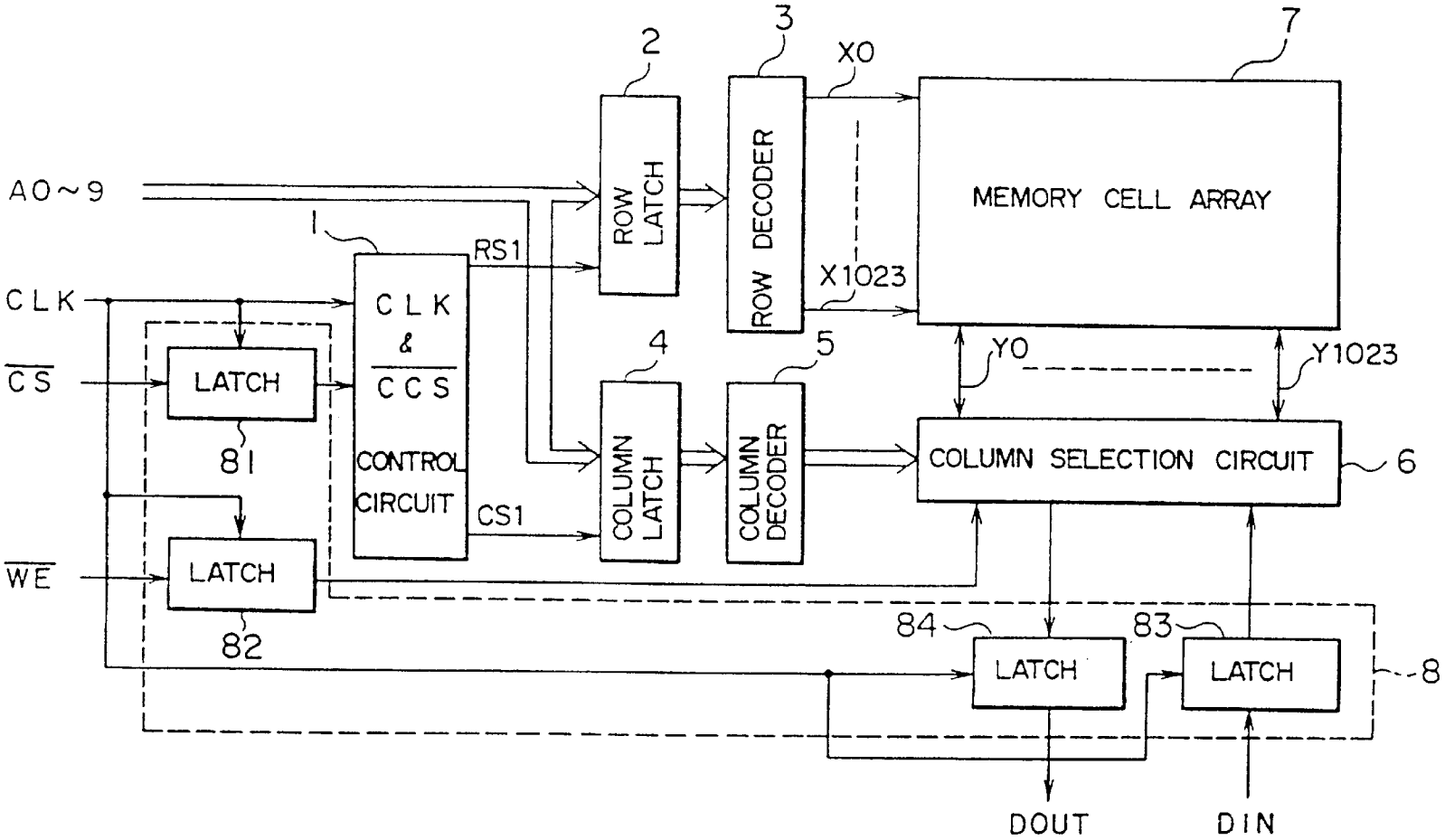
FIG. 1 is a block diagram of the semiconductor memory according to an embodiment of this invention.

In FIG. 1, a system clock CLK, which is produced inside a computer system, is supplied from the outside of the semiconductor memory, and it is delivered to the clock input terminals of latches 81–84 in a latch circuit 8 and the clock input terminal of a control circuit 1. Also supplied from the outside are a chip select signal $\overline{CS}$, write enable signal $\overline{WE}$, and write data DIN, that are delivered to the latches 81–83 in the latch circuit 8 in synchronism with the system clock CLK. The readout data DOUT from the latch 84 in the latch circuit 8 is delivered to the outside.

The control circuit 1 produces a row address set signal RS1, which is delivered to the set input terminal of a row latch 2, which then introduces a row address multiplexed in the address signals A0–A9. Similarly, the column address set signal CS1 is delivered to the set input terminal of a column latch 4, which then introduces a column address multiplexed in the address signals A0–A9. Thus, the control circuit 1 and latches 2,4 demultiplex the address signals A0–A9.

The row latch 2 has its output signals delivered to the input terminals of a row decoder 3, which produces output signals X0–X1023 that are placed on the row lines (not shown) of a memory cell array 7. The column latch 4 has its output signals delivered to the input terminals of a column decoder 5, which produces output signals that are applied to the input terminals of a column selection circuit 6. The column selection circuit 6 responds to the output signal of the column decoder 5 to select one of data input/output signals Y0–Y1023 of the memory cell array 7, so that the output of the latch 83 is written into a cell in write mode or data is read out to the latch 84 in read mode.

Figure 2A:
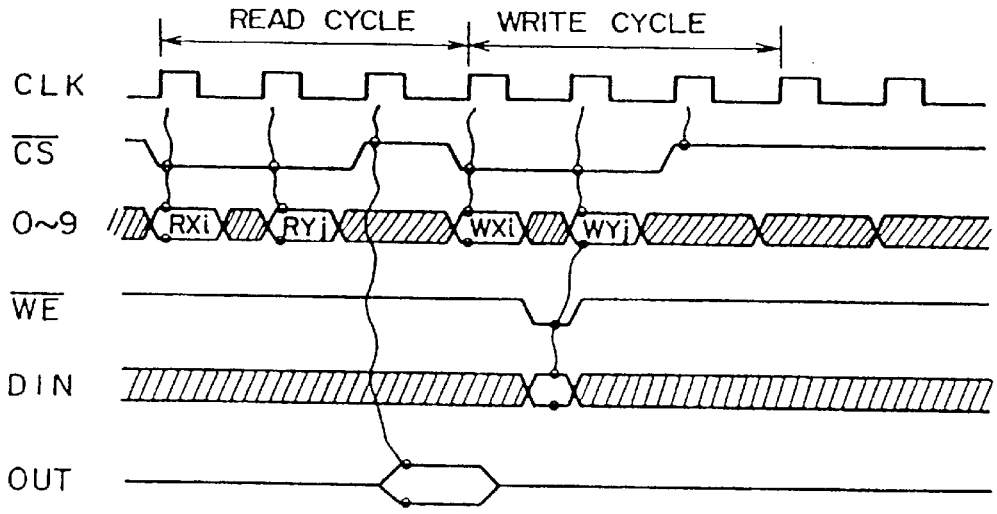
FIGS. 2A and 2B are timing charts used to explain the operation of the arrangement shown in FIG. 1.
Figure 2B:
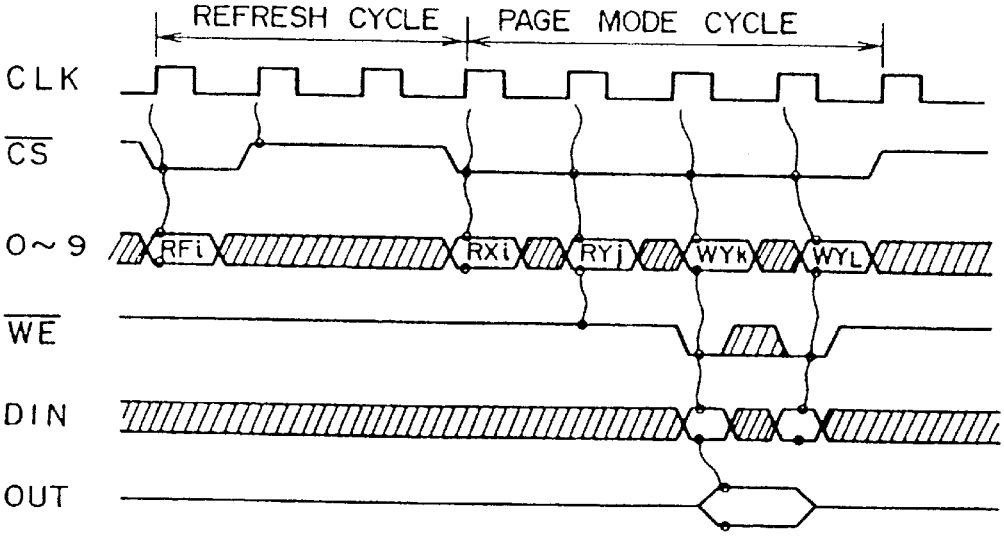

The operation of the foregoing arrangement will be explained on the timing charts of FIGS. 2A and 2B. FIG. 2A shows the read cycle and write cycle, and FIG. 2B shows reading and writing in the *page mode cycle, and the* refresh cycle [and page mode cycle].

Read Cycle

The chip select signal $\overline{CS}$ is brought to a low level before the clock signal CLK first rises in its read cycle, and a row address RXi is applied to the address terminals A0–A9. The row address set signal RS1 is produced at the first rising edge of the clock CLK, and the row address RXi is latched in the latch 2 shown in FIG. 1. The row decoder 3 decodes the row address RXi which is latched in the row latch 2 thereby to activate a selected one of the row lines X0–X1023, and the read operation starts. Subsequently, a column address RYi is applied to the address terminals A0–A9 before the second rise of the clock signal CLK of the READ cycle. Then, the column address set signal CS1 is produced at the second rising edge of the clock signal CLK, and the column address RYi is latched in the column register 4 shown in FIG. 1. The column decoder 5 decodes the column address RYi which is latched in the column latch 4, and the column selection circuit 6 selects one of data read out to the data input/output signal lines Y0–Y1023. Subsequently, at the third rise of the clock signal CLK in the READ cycle, the data which has been selected by the column selection circuit 6 is latched in the latch 84 in the latch circuit 8, and it is delivered as valid data at the terminal DOUT. The chip select signal $\overline{CS}$ is brought to a high level before third rise of the the clock signal CLK in the READ cycle, and the READ cycle operation for the memory cell array 7 completes at the fourth rise of the clock signal CLK.

Write Cycle

The operation until the rise of the first clock signal CLK is identical to the read cycle, and the explanation is omitted. The write enable signal $\overline{WE}$ is made low before the second rise of the clock signal CLK of the WRITE cycle, and write data is applied to the data input terminals DIN. The column address WYi is latched at the second rise of the clock signal CLK, and the write data at DIN terminal is latched in the latch 83 in the latch circuit 8. The write data is transferred to one of the data input/output signal lines Y0–Y1023 selected with the column address WYi by the column selection circuit 6, and it is written to the row line selected with the row address WXi.

Refresh Cycle

As in the read or write cycle, a refresh address RFi is latched in the row latch in response to the clock signal CLK of the first cycle and the row decoder 3 decodes the refresh address RFi latched in the latch 2 to activate *a* selected one of the row lines X0–X1023, and the refresh operation starts. Subsequently, the chip select signal $\overline{CS}$ is made high before the second clock signal CLK goes high. The chip select signal $\overline{CS}$ is disactivated when the second clock signal CLK rises, causing the column latch 4, column decoder 5 and column selection circuit 6 to quit operation, and the data input/output operation does not take place. The clock signal CLK of the [third] *second* cycle is a dummy for making cycles consistent with the read and write cycle, and the refresh cycle completes by using clock signals CLK of three cycles.

Page Mode Cycle

The operations until the rise of the first and second rise of clock signal CLK are identical to the read or write cycle, and the explanation is omitted. In the third and following rises, reading or writing takes place in synchronism with the rising of the clock signal CLK for the row address (RXi or WXi respectively) and a column address ($RY_K$, $RY_L$ or $WY_K$, $WY_L$ respectively), which is different from the column address ($RY_j$ or $WY_j$) entered in the first and second cycles. The page mode cycle continues until the chip select signal $\overline{CS}$ goes high. The figure shows the case in which row address RXi and column addresses $RY_j$, $WY_K$ and $WY_L$ are given in the respective first through fourth rises of the clock signal CLK.

Figure 3:
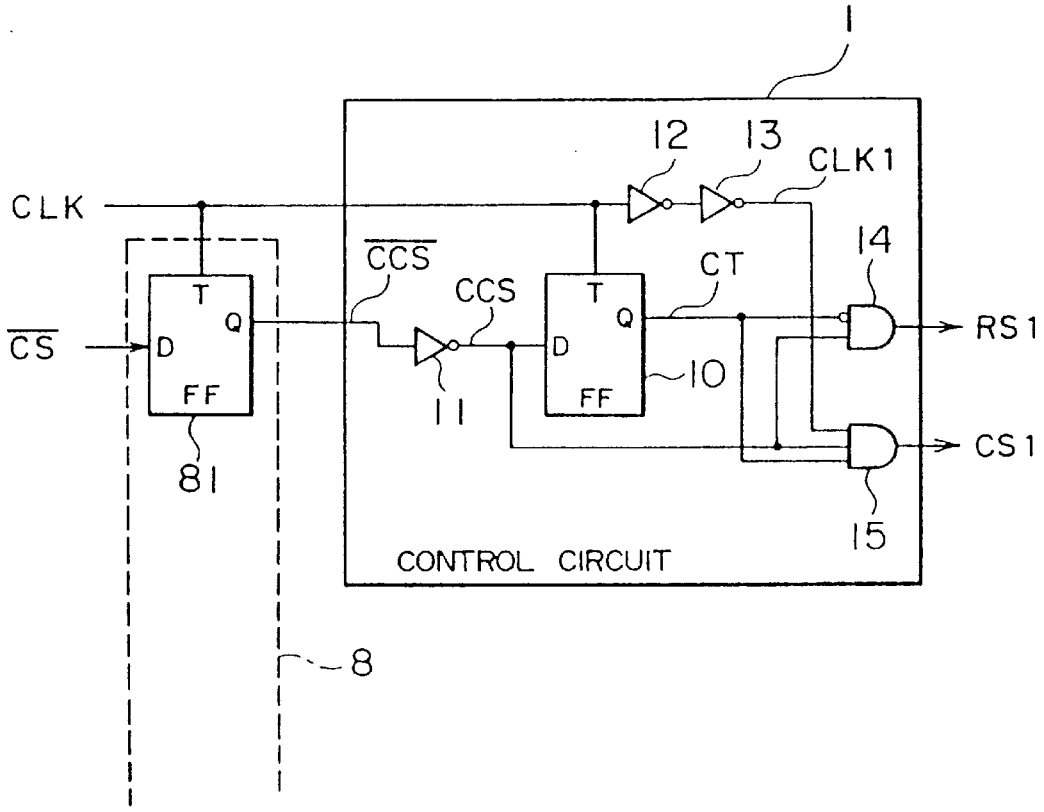
FIG. 3 is a diagram showing the control circuit and its periphery in FIG. 1.

FIG. 3 is a diagram showing the control circuit 1 and its periphery in FIG. 1. In the figure, the chip select signal $\overline{CS}$ is applied to the data input terminal of the latch 81 in the latch circuit. The clock CLK is connected to the edge trigger T of the latch 81 the edge trigger T of the latch 10 in the control circuit 1 input terminal and delay circuit 12, 13.

The output signal $\overline{CCS}$ of the latch 81 is delivered to the inverter 11, which has an output CCS delivered to the data input terminal of latch 10 and input terminals of the two-input AND gate 14 and three-input AND gate 15. The delay circuit 12, 13 has its output signal CLK1 applied to the input terminal of the three-input AND gate 15.

The latch 10 has its output signal CT applied to the inverting input terminal of the two-input AND gate 14 and *to the input terminals of the* three-input AND gate 15. The two-input AND gate 14 produces the row address set signal RS1 and the three-input AND gate 15 produces the column address set signal CS1.

The operation of the circuit arrangement shown in FIG. 3 will be explained for its read (write) cycle, refresh cycle and page mode read (or write) cycle, for example, on the timing charts of FIGS. 4, 5 and 6.

In the read (or write) cycle of FIG. 4, the chip select signal $\overline{CS}$ is made low before the clock signal CLK rises at $t_1$, and a low chip select signal $\overline{CS}$ is latched in the latch 81 at the rise of the clock signal CLK at $t_1$. At this time point $t_1$, the output signal $\overline{CCS}$ of the latch 81 is high. Because of a low data input signal CCS of the latch 10, it latches the signal at the low level. The output signal CT of the latch 10 stays low until the rise of the next clock signal CLK at $t_2$. Because of a low input signal CCS of the two-input AND gate 14, it produces a low output signal RS1 at $t_1$.

After the clock signal CLK has risen at $t_1$, the output signal $\overline{CCS}$ of the latch 81 goes low. Consequently, the output signal CCS of the inverter 11 goes high, causing the two-input AND gate 14 to output a low inverted input signal CT, and with high input signal CCS the AND gate 14 produces a high row address set signal RS1.

Next, when the clock signal CLK rises at $t_2$, the latch 10 has a high data input signal CCS and it latches the high-level signal. After the clock signal CLK has risen at $t_2$, the output signal CT of the latch 10 goes high. Because of inverting the high signal CT at the input of the two-input AND gate 14, it produces a low output signal RS1. As the input signals CCS and CT of the three-input AND gate 15 are high shortly after $t_2$, a clock signal CLK1 which is a delayed derivative of the clock signal CLK has its high-level portion between $t_2$ and $t_3$ delivered as a column address set signal CS1.

Through the foregoing operation, it becomes possible to introduce a row address and column address in the address signal A0–A9 to the row latch 2 and column latch 4 sequentially.

Next, by making the chip select signal $\overline{CS}$ high before the clock signal CLK rises at $t_3$, a high-level signal is latched in the latch 81 at the rise of the clock signal CLK. After the clock signal CLK has risen at $t_3$, the output signal $\overline{CCS}$ of the latch 81 goes high. Accordingly, the signal CCS goes low, and the column address set signal CS1 produced by the three-input AND gate 15 goes low and stays low until the next rise of the clock signal CLK and lowering of the chip select signal CS.

Next, when the clock signal CLK rises at $t_4$, the signal CCS is low and the latch 10 latches the low-level signal to lower its output CT. After the clock signal CLK has risen at $t_4$, the output signal $\overline{CCS}$ of the latch 81 goes low. Because of a low output signal CT of the latch 10, the two-input AND gate 14 produces a high row address set signal RS1 in response to the rise of its other input signal CCS.

The $t_1$ cycle and $t_4$ cycle have the same operation as described above, and it becomes possible to run the read (or write) cycles repeatedly.

Figure 5:
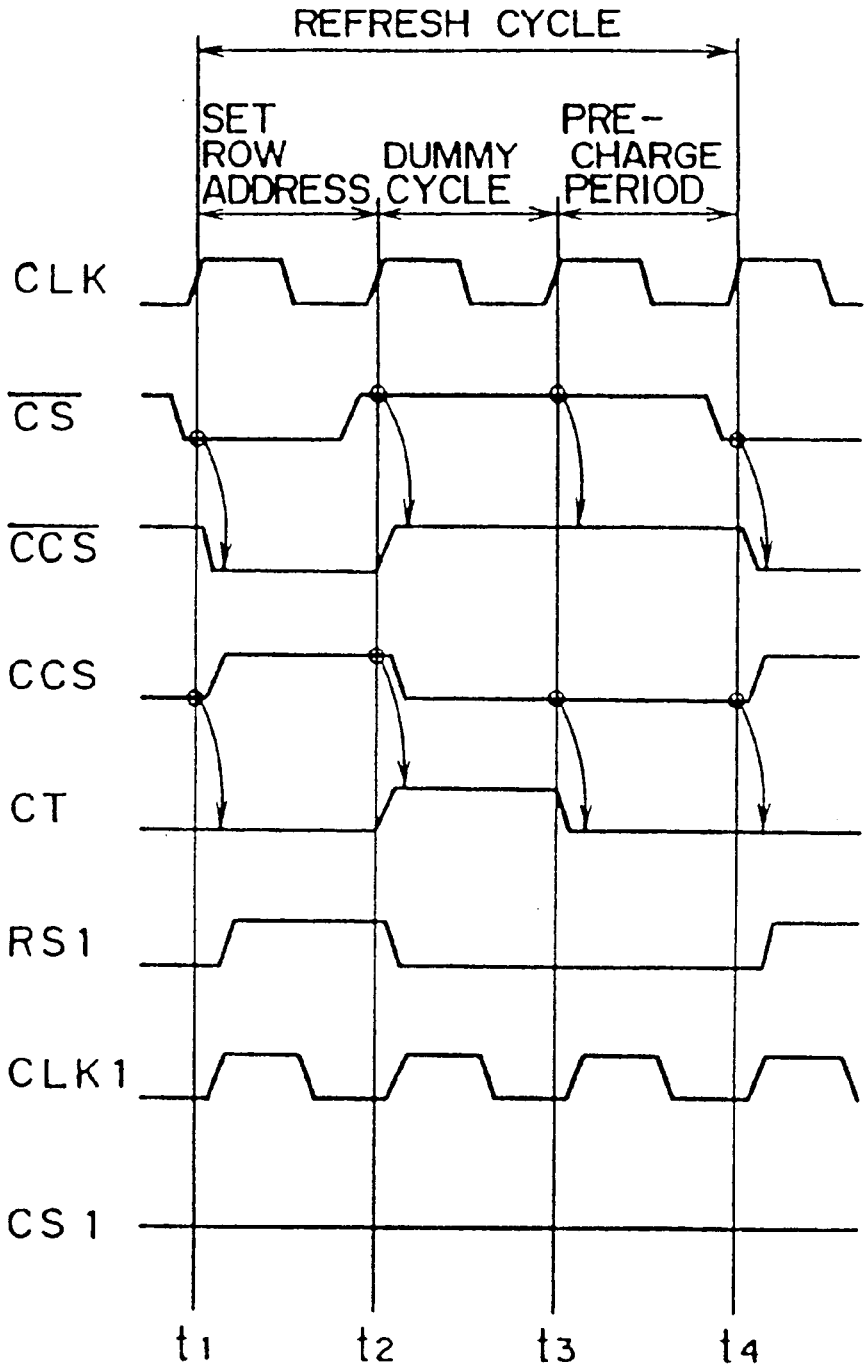

FIG. 5 shows the refresh cycle. The cycle of $t_1$ is identical to that of $t_1$ of the read (or write) cycle, and explanation thereof is omitted. Since the refresh cycle does not need the column address, the chip select signal $\overline{CS}$ is made high before the clock signal CLK rises at $t_2$ so as to retain the high input signal $\overline{CS}$ to the latch 81. After the clock signal CLK has risen at $t_2$, output signal $\overline{CCS}$ of the latch 81 goes high, causing the inverter 11 to have a low inverting output signal CCS. Consequently, the low input signal CCS to the three-output AND gate 15 causes it to produce a column address set signal CS1 at a low level.

In the cycle of $t_3$, the input signal CCS common to the two-input AND gate 14 and three-input AND gate 15 is low, and therefore the row address set signal RS1 and column address set signal CS1 are low. The operation of the $t_4$ cycle is identical to that of $t_1$ in FIG. 4 and explanation thereof is omitted.

In this manner, a row address in the address signal A0–A9 is introduced to the row latch 2 and no column address is introduced for the refresh cycle.

Figure 6:
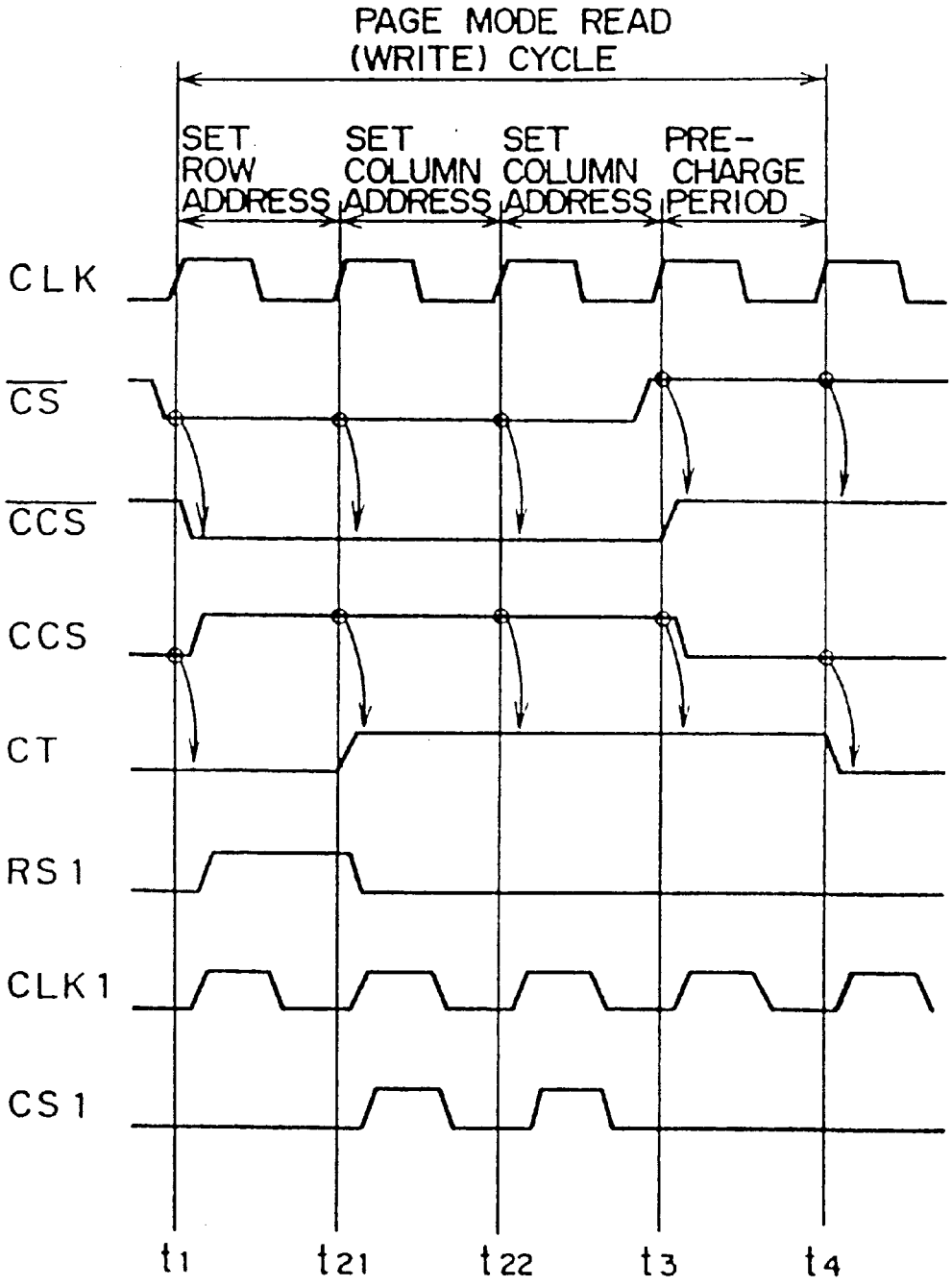

FIG. 6 shows the page mode read (or write) cycle. The cycle of $t_1$ operates identically to that of $t_1$ in FIG. 4, in which a row address in the address signal A0–A9 is introduced to the row latch 2. The cycle of $t_{21}$ operates identically to that of $t_2$ in FIG. 4, in which a column address in the address signal A0–A9 is introduced to the column latch 4.

In the cycle of $t_{22}$, a column address in the address signal A0–A9 is introduced again to column latch 4, as in the $t_{21}$ cycle. Namely, only column addresses are introduced successively. The cycle of $t_3$ is identical to that of $t_3$ in FIG. 4 and the explanation thereof is omitted.

In this manner, for the page mode read (or write) cycle, a row address in the address signal A0–A9 is introduced to the row latch 2, and thereafter column addresses in the address signal A0–A9 are introduced successively to the column latch 4.

According to the foregoing embodiment, a semiconductor memory which is based on address multiplexing and is operative on a single clock signal can be accomplished by merely adding a few latch circuits and associated control circuit to the conventional MOS dynamic RAM.

Although the foregoing embodiment is the case of writing and reading for one-bit data, this invention is not confined to this case, but the arrangement for dealing with multiple-bit data can also be accomplished. Although in the foregoing embodiment an external row address is introduced for the refresh address, it is also possible to provide an internal address counter, thereby eliminating the need of the external address input.

We claim:

1. A semiconductor memory chip, comprising:

a memory cell array;

means of receiving an address signal having a row address signal and a column address signal in such a manner that the row address signal is received first and then the column address signal is subsequently received;

means of communication with the outside for inputting and outputting data to and from said memory cell array;

means for receiving a clock signal having a series of clock pulses;

means for receiving a chip select signal from the outside which represents that the semiconductor memory is selected;

means responsive to the clock signal and the chip select signal for generating a row address set signal and a column address set signal, wherein the row address set signal is generated under a circumstance where the semiconductor memory receives a firstly occurred clock pulse of the series of the clock pulses of the clock signal while the chip select signal is being provided to the semiconductor memory, and wherein the column address set signal is generated under a circumstance where the semiconductor memory receives a subsequent clock pulse while the chip select signal is being provided to the semiconductor memory;

means responsive to the row address set signal for setting the address signal from the means of receiving as the row address signal and for providing the memory cell array with the set row address signal; and means responsive to the column address set signal for setting the address signal from the means of receiving as the column address signal and for providing the memory cell array with the set column address signal.

2. A semiconductor memory according to claim 1, wherein said memory cell array is of the dynamic type which requires a refresh operation, and [wherein said control means controls the refresh operating] *further including means for conducting the refresh operation* based on said clock signal.

3. A semiconductor memory according to claim 1 operable with a page mode, wherein the means for generating further generates a continuous series of column address set signals in synchronism with said clock signal as long as the chip select signal is provided, whereby memory access to a plurality of memory cells belonging to the same row is continuously performed in accordance with the series of the column address set signals.

4. A semiconductor RAM chip, comprising:

an address input terminal for receiving an address signal having row and column addresses time multiplexed;

a chip select input terminal for receiving a chip select signal to indicate the selection of the semiconductor RAM;

a clock input terminal for receiving a clock having a single periodic succession of clock pulses;

a memory cell array;

a data output terminal connected to said memory cell array to output data from said memory cell;

a data input terminal connected to said memory cell array for receiving data for said memory cell;

a row address decoder having a row address input and an output connected to said memory cell array;

a column address decoder having a column address input and an output connected to said memory cell array; and means for receiving the multiplexed address signal from said address input terminal and the clock from said clock input terminal, and for outputting the row address to the input of the row address decoder separate from the column address and outputting the column address to the input of the column address decoder separate from the row address in response to only the clock when the chip select signal at said chip select input terminal indicates the selection of the semiconductor RAM.

5. The semiconductor RAM of claim 4, further comprising:

a column selection circuit operatively connected between said memory cell array and each of said data output terminal, data input terminal and means for receiving and outputting;

an enable input terminal for receiving an enable signal to indicate a selection of one of a write operation and a read operation;

said column selection circuit including means responsive to said enable signal for controlling the data connection between said memory cell array and each of said data input terminal and data output terminal;

a latch operatively connected between said data output terminal and said column selection circuit for the transfer of data and operatively connected to said clock input terminal for controlling the transferred timing;

a latch operatively connected between said data input terminal and said column selection circuit for the transfer of data and operatively connected to said clock input terminal for controlling the transferred timing;

latch means operatively connected between said chip select input terminal and said means for receiving and outputting, and connected to receive the clock from said clock input terminal;

latch means operatively connected between said enable input terminal and said column selection circuit, and connected to receive the clock [form] *from* said clock input terminal;

said means for receiving and outputting including a control circuit connected to said clock input terminal for receiving the clock, connected to said chip select input terminal for receiving the chip select signal through the corresponding latch means, outputting a row address set signal, and outputting a column address set signal;

said means for receiving and outputting further including row latch means operatively connected to said address input terminal for receiving the multiplexed address signal and outputting only the row address signal in response to the row address set signal [form] *from* the control circuit to said row address decoder, and said means for receiving and outputting further including column latch means operatively connected to said address input terminal for receiving the multiplexed address signal and outputting only the column address signal in response to the column address set signal from the control circuit to said column address decoder.

6. The semiconductor RAM of claim 5, wherein said [control circuit] *means for receiving and outputting* consists of latch and logic elements.

7. The semiconductor RAM of claim 6, wherein said [control circuit] *means for receiving and outputting* includes delay means for producing a delayed clock from the clock, first AND-gate means inputting the clock and a chip select signal and outputting the row address [et] *set* signal, second AND-gate means inputting the chip select signal and the clock for outputting the column address set signal.

8. The semiconductor RAM of claim 7, wherein said first and second AND-gate means are operative on the opposite sign logic of the clock with respect to each other.

9. The semiconductor RAM of claim 7, wherein said [control circuit] *means for receiving and outputting* further includes a latch operative to feed the chip select signal to only one of said first and second AND-gate means synchronized with the clock, and the other of said first and second AND-gate means receiving the chip select signal bypassing the latch.

10. The semiconductor RAM of claim 4, wherein said means for receiving and [operating] *outputting* produces a row address set signal from only the clock and the chip select signal and further produces a column address set signal from only the clock and the chip select signal; and first means for separating the row address from the multiplexed address signal and feeding the separated row address to said row address decoder in response to only the row address set signal, and second means for separating the column address from the multiplexed address signal and feeding the separated column address to said column address decoder in response to only the column address set signal.

11. The semiconductor RAM of claim 10 , wherein said [control circuit] *means for receiving and outputting* is responsive to the first operative [pule] *pulse* of the clock when the chip select signal indicates selection of the semiconductor RAM for outputting the row address set signal.

12. The semiconductor RAM of claim 11, wherein said [control circuit] *means for receiving and outputting* is responsive to the second operative pulse of the clock when the chip select signal indicates selection of the semiconductor RAM for outputting the column address set signal.

13. The semiconductor RAM of claim 12, wherein said [control circuit] *means for receiving and outputting* is responsive to the third operative pulse of the clock when the chip select signal indicates selection of the semiconductor RAM for again outputting the column address set signal to provide a page mode by merely extending the duration of the chip select signal.

14. The semiconductor RAM of claim 13, wherein said [control circuit] *means for receiving and outputting* determines the operative pulse of the clock as an edge of each successive pulse of the clock.

15. A semiconductor memory chip, comprising:

an address input terminal for receiving an address signal having row and column addresses time multiplexed;

an input terminal for receiving a control signal that is selectively active;

a clock input terminal for receiving a clock having a single periodic succession of clock pulses;

a memory cell array;

a data output terminal connected to said memory cell array to output data from said memory cell *array*;

a row address decoder having a row address input and an output connected to said memory cell array;

a column address decoder having a column address input and an output connected to said memory cell array; and demultiplexing means for receiving the multiplexed address signal from said address input terminal and the clock from said clock input terminal, and for outputting the row address to the input of the row address decoder separate from the column address and outputting the column address to the input of the column address decoder separate from the row address in response to only the timing of the clock when the control signal at said input terminal is active.

16. The semiconductor memory of claim 15, further comprising:

a data input terminal connected to said memory cell array for receiving data for said memory cell;

a column selection circuit operatively connected between said memory cell array and each of said data output terminal, data input terminal and *demultiplexing* means for receiving and outputting;

an enable input terminal for receiving an enable signal to indicate a selection of one of a write operation and a read operation;

said column selection circuit including means responsive to said enable signal for controlling the data connection between said memory cell array and each of said data input terminal and data output terminal;

a latch operatively connected between said data output terminal and said column selection circuit for the transfer of data and operatively connected to said clock input terminal for controlling the transferred timing;

a latch operatively connected between said data input terminal and said column selection circuit for the transfer of data and operatively connected to said clock input terminal for controlling the transferred timing;

latch means operatively connected between said input terminal of the control signal and said *demultiplexing* means for receiving and outputting, and connected to receive the clock from said clock input terminal;

latch means operatively connected between said enable able input terminal and said column selection circuit, and connected to receive the clock from said clock input terminal;

said *demultiplexing* means for receiving and outputting including a control circuit connected to said clock input terminal for receiving the clock, connected to said input terminal for receiving the control signal through the corresponding latch means, outputting a row address set signal, and outputting a column address set signal;

said *demultiplexing* means for receiving and outputting further including row latch means operatively connected to said address input terminal for receiving the multiplexed address signal and outputting only the row address signal in response to the row address set signal from the control circuit to said row address decoder, and said *demultiplexing* means for receiving and outputting further including column latch means operatively connected to said address input terminal for receiving the multiplexed address signal and outputting only the column address signal in response to the column address set signal from the control circuit to said column address decoder.

17. The semiconductor memory of claim 16, wherein said control circuit consists of latch and logic elements.

18. The semiconductor memory of claim 17, wherein said control circuit includes delay means for producing a delayed clock from the clock, first AND-gate means inputting the clock and a chip select signal and outputting the row address set signal, second AND-gate means inputting the chip select signal and the clock for outputting the column address set signal.

19. The semiconductor memory of claim 18, wherein said first and second AND-gate means are operative on the opposite sign logic of the clock with respect to each other.

20. The semiconductor memory of claim 17, wherein said control circuit further includes a latch operative to feed the control signal to only one of said first and second AND-gate means synchronized with the clock, and the other of said first and second AND-gate means receiving the control signal bypassing the latch.

21. The semiconductor memory of claim 15, wherein said *demultiplexing* means for receiving and [operating] *outputting* produces a row address set signal from only the clock and the control signal and further produces a column address set signal from only the clock and the control signal; and first means for separating the row address from the multiplexed address signal and feeding the separated row address to said row address decoder in response to only the row address set signal, and second means for separating the column address from the multiplexed address signal and feeding the separated column address to said column address decoder in response to only the column address set signal.

22. The semiconductor memory of claim 21, wherein said control circuit is responsive to the first operative [pule] *pulse* of the clock when the control signal is active for outputting the row address set signal.

23. The semiconductor memory of claim 22, wherein said control circuit is responsive to the second operative pulse of the clock when the control signal is active for outputting the column address set signal.

24. The semiconductor memory of claim 23, wherein said control circuit is responsive to the third operative pulse of the clock when the control signal is active for again outputting the column address set signal to provide a page mode by merely extending the duration of the chip select signal.

25. The semiconductor memory of claim 24, wherein said control circuit determines the operative pulse of the clock as an edge of each successive pulse of the clock.

*26. A semiconductor dynamic memory chip, comprising:*

*a dynamic type random access memory cell array:*

*an address input terminal to be supplied with address signals having time multiplexed row address signals and column address signals;*

*a row address latch having an input which is supplied with said row address signals from said address input terminal;*

*a column address latch having an input which is supplied with said column address signals from said address input terminal;*

*a first latch circuit having an input which is supplied with an external chip select signal and a latch timing control terminal which is supplied with an external clock signal having a continuous succession of clock pulses of constant period;*

*a second latch circuit having an input which is supplied with a write enable signal and a latch timing control terminal which is supplied with said external clock signal;*

*a data input latch circuit having a data input which is supplied with an external data, a latch timing control terminal which is supplied with said external clock signal and a data output terminal which is coupled with said dynamic type random access memory cell array;*

*a data output latch circuit having a data input which is coupled with said dynamic type random access memory cell array, an output timing control terminal which is supplied with said external clock signal and a data output terminal;*

*a row address decoder having an input which is coupled with an output of said row address latch and an output which is coupled with said dynamic type random access memory cell array; and*

*a column address decoder having an input which is coupled with an output of said column address latch and an output which is coupled with said dynamic type random access memory cell array,*

*wherein said row address latch latches said row address signals in response to said external chip select signal latched by said first latch circuit and to a first level change of said external clock signal, and*

*wherein said column address latch latches said column address signals in response to said external chip select signal latched by said first latch circuit and to a second level change which appears after said first level change of said external clock signal.*

*27. A semiconductor dynamic memory chip according to claim 26,*

*wherein said data input latch circuit latches an input data in synchronism with said second level change.*

*28. A semiconductor dynamic memory chip according to claim 26,*

*wherein said data output latch circuit outputs an output data in synchronism with a third level change which appears after said second level change of said external which appears after said second level change of said external clock signal.*

*29. A semiconductor dynamic memory chip according to claim 26,*

*wherein said data input latch circuit latches an input data in synchronism with said second level change, and*

*wherein said data output latch circuit outputs an output data in synchronism with a third level change which appears after said second level change of said external clock signal.*

*30. A semiconductor dynamic memory chip according to claim 29,*

*wherein said column address latch latches a column address in response to the third level change of said*

*external clock signal at which said data output latch circuit outputs the output data.*

*31. A semiconductor dynamic memory chip according to claim 29,*

*wherein said column address latch latches repeatedly column address signals in response to each of a plurality of level changes which appear after said first level change of said external clock signal under a state that said row address latch latches said row address signals in response to said first level change.*

*32. A semiconductor dynamic memory chip according to claim 31,*

*wherein said column address latch latches a column address in response to the third level change of said external clock signal at which said data output latch circuit outputs an output data.*

*33. A semiconductor dynamic memory chip according to claim 26,*

*wherein said external chip select signal has a predetermined low level, and*

*wherein said first level change and said second level change go from a low level to a high level.*

* * * * *